(12) United States Patent
Kinoshita (10) Patent No.: US 10,546,868 B2
(45) Date of Patent: Jan. 28, 2020

(54) SEMICONDUCTOR MEMORY DEVICE INCLUDING AN INSULATING PORTION ADJACENT TO FIRST AND SECOND PLURALITIES OF CONDUCTIVE LAYERS

(71) Applicant: Toshiba Memory Corporation, Minato-ku (JP)

(72) Inventor: Shigeru Kinoshita, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/646,245

(22) Filed: Jul. 11, 2017

(65) Prior Publication Data

US 2018/0019253 A1 Jan. 18, 2018

(30) Foreign Application Priority Data

Jul. 15, 2016 (JP) .................................. 2016-140142

(51) Int. Cl.
| | |
|---|---|
| *H01L 29/76* | (2006.01) |
| *H01L 27/11565* | (2017.01) |
| *H01L 27/1157* | (2017.01) |
| *H01L 27/11517* | (2017.01) |

(Continued)

(52) U.S. Cl.
CPC .... *H01L 27/11565* (2013.01); *H01L 27/1157* (2013.01); *H01L 27/11517* (2013.01); *H01L 27/11556* (2013.01); *H01L 27/11582* (2013.01)

(58) Field of Classification Search
CPC ........... H01L 27/11565; H01L 27/1157; H01L 27/11582; H01L 27/11517; H01L 27/11556
See application file for complete search history.

(56) References Cited

U.S. PATENT DOCUMENTS

| | | | | |
|---|---|---|---|---|
| 8,724,377 B2* | 5/2014 | Yamanaka | ............... | H01L 43/08 |
| | | | | 365/130 |
| 8,957,495 B2* | 2/2015 | Sakui | ................... | H01L 29/7889 |
| | | | | 257/499 |
| 9,343,475 B2* | 5/2016 | Jang | ................... | H01L 27/11582 |

(Continued)

FOREIGN PATENT DOCUMENTS

| | | |
|---|---|---|
| JP | 2012-174872 | 9/2012 |
| JP | 2015-012296 A | 1/2015 |
| JP | 2015-099923 A | 5/2015 |

*Primary Examiner* — Ismail A Muse
(74) *Attorney, Agent, or Firm* — Oblon, McClelland, Maier & Neustadt, L.L.P.

(57) ABSTRACT

According to one embodiment, a semiconductor memory device includes a stacked body, first memory portions, and second memory portions. The stacked body includes conductive layers. The conductive layers are arranged in a first direction and extend in a second direction. The stacked body includes first and second regions. The second region is arranged with the first region in the second direction. The first memory portions extend in the first direction through the first region and are arranged at a first pitch along the second direction. The second memory portions extend in the first direction through the second region and are arranged at the first pitch along the second direction. A distance between a first center of one of the first memory portions and a second center of one of the second memory portions is longer than the first pitch and shorter than 2 times the first pitch.

19 Claims, 7 Drawing Sheets

(51) Int. Cl.
*H01L 27/11556* (2017.01)
*H01L 27/11582* (2017.01)

(56) References Cited

U.S. PATENT DOCUMENTS

| | | | |
|---|---|---|---|
| 9,553,103 B2 * | 1/2017 | Sakui | H01L 29/7889 |
| 10,103,155 B2 * | 10/2018 | Sakaike | H01L 27/11519 |
| 2007/0272973 A1 * | 11/2007 | Park | B82Y 10/00 |
| | | | 257/324 |
| 2011/0076819 A1 * | 3/2011 | Kim | H01L 27/11551 |
| | | | 438/279 |
| 2012/0218836 A1 | 8/2012 | Ozawa | |
| 2013/0292630 A1 | 11/2013 | Sasago et al. | |
| 2015/0063014 A1 * | 3/2015 | Sakai | G11C 11/1673 |
| | | | 365/158 |
| 2015/0200203 A1 * | 7/2015 | Jang | H01L 27/11582 |
| | | | 257/324 |
| 2015/0340610 A1 * | 11/2015 | Jung | H01L 45/1293 |
| | | | 257/4 |
| 2016/0093631 A1 | 3/2016 | Yun et al. | |
| 2016/0260815 A1 * | 9/2016 | Ohba | H01L 29/42324 |
| 2017/0077119 A1 * | 3/2017 | Sawabe | H01L 27/11582 |
| 2018/0019257 A1 * | 1/2018 | Son | H01L 23/5283 |
| 2018/0240812 A1 * | 8/2018 | Barbato | H01L 27/11582 |
| 2018/0261613 A1 * | 9/2018 | Ariyoshi | H01L 23/5226 |

* cited by examiner

SEMICONDUCTOR MEMORY DEVICE INCLUDING AN INSULATING PORTION ADJACENT TO FIRST AND SECOND PLURALITIES OF CONDUCTIVE LAYERS

CROSS-REFERENCE TO RELATED APPLICATIONS

This application is based upon and claims the benefit of priority from Japanese Patent Application No. 2016-140142, filed on Jul. 15, 2016; the entire contents of which are incorporated herein by reference.

FIELD

Embodiments described herein relate generally to semiconductor memory device and a method for manufacturing the same.

BACKGROUND

It is desirable to increase the storage density of a semiconductor memory device.

DETAILED DESCRIPTION

According to one embodiment, a semiconductor memory device includes a stacked body, a plurality of first memory portions, and a plurality of second memory portions. The stacked body includes a plurality of conductive layers. The plurality of conductive layers are arranged in a first direction and extend in a second direction crossing the first direction. The stacked body includes a first region and a second region. The second region is arranged with the first region in the second direction. The plurality of first memory portions extend in the first direction through the first region and are arranged at a first pitch along the second direction. The plurality of second memory portions extend in the first direction through the second region and are arranged at the first pitch along the second direction. A distance along the second direction between a first center in the second direction of one of the plurality of first memory portions and a second center in the second direction of one of the plurality of second memory portions is longer than the first pitch and shorter than 2 times the first pitch.

According to one embodiment, a method for manufacturing a semiconductor memory device is disclosed. The method can include forming a stacked film on a surface of a base body. The stacked film includes a plurality of first films and a second film. The plurality of first films are arranged in a first direction. The first direction is perpendicular to the surface. The second film is provided between the plurality of first films. The method can include forming a plurality of first memory portions and a plurality of second memory portions. The plurality of first memory portions extend in the first direction through a first region of the stacked film and are arranged at a first pitch in a second direction crossing the first direction. The plurality of second memory portions extend in the first direction through a second region of the stacked film and are arranged at the first pitch in the second direction. The second region is arranged with the first region in the second direction. A distance along the second direction between a first center in the second direction of one of the plurality of first memory portions and a second center in the second direction of one of the plurality of second memory portions is longer than the first pitch and shorter than 2 times the first pitch. The method can include forming a hole in the stacked film and removing the plurality of first films via the hole. In addition, the method can include introducing a material into a space formed where the plurality of first films is removed. The material is used to form a conductive layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1:
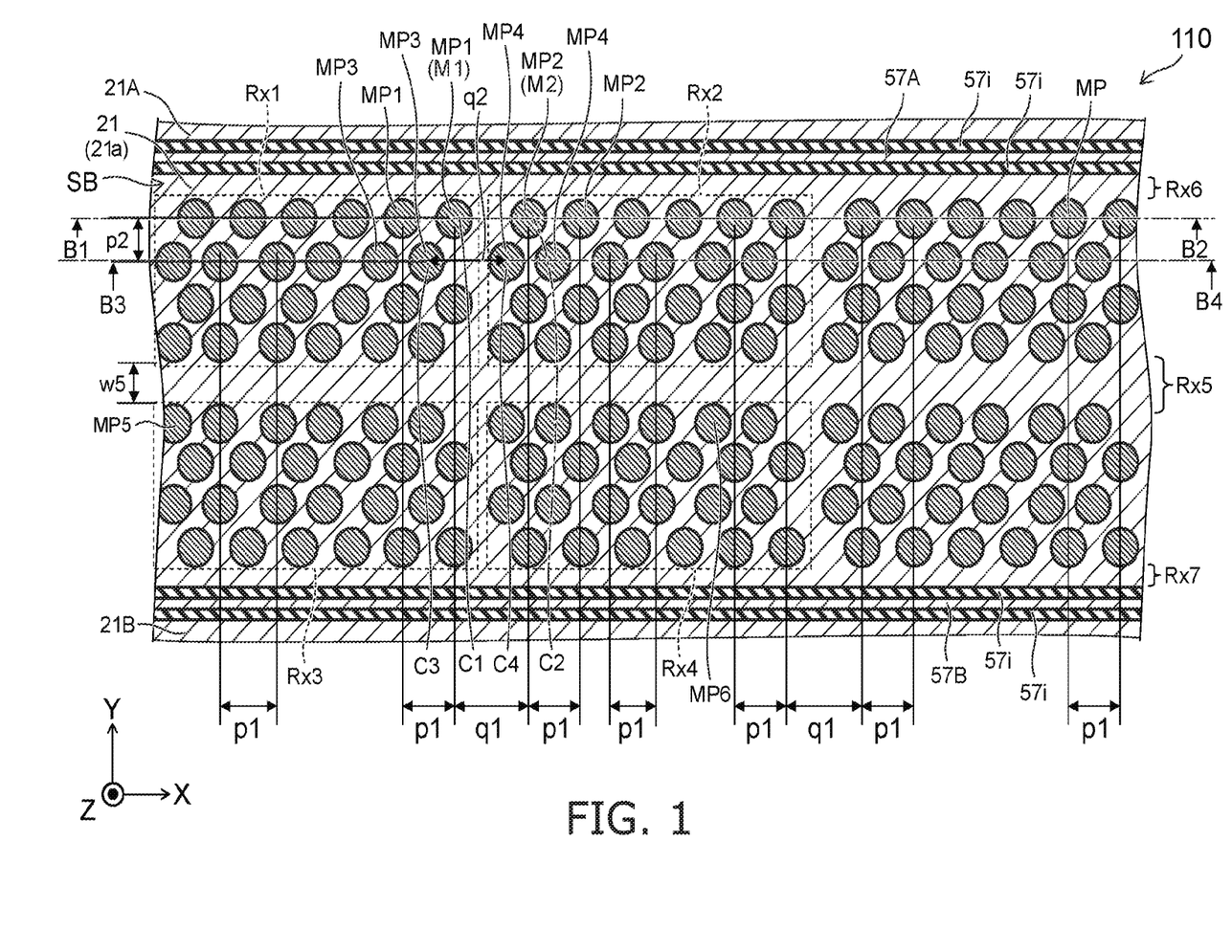
FIG. 1 is a schematic cross-sectional view illustrating a semiconductor memory device according to a first embodiment.

FIG. 1 is a schematic cross-sectional view illustrating a semiconductor memory device according to a first embodiment.

Figure 2A:
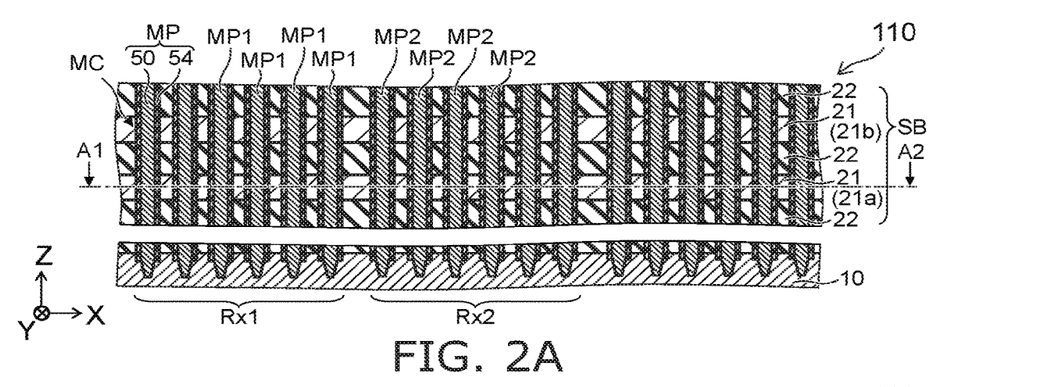
FIG. 2A and FIG. 2B are schematic cross-sectional views illustrating the semiconductor memory device according to the first embodiment.
Figure 2B:
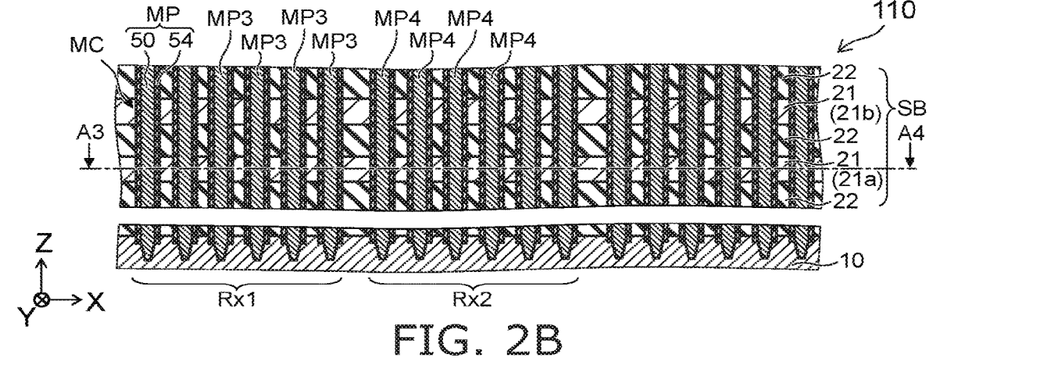

FIG. 2A and FIG. 2B are schematic cross-sectional views illustrating the semiconductor memory device according to the first embodiment.

FIG. 1 is a line A1-A2 cross-sectional view of FIG. 2A. FIG. 1 also is a line A3-A4 cross-sectional view of FIG. 2B. FIG. 2A is a line B1-B2 cross-sectional view of FIG. 1. FIG. 2B is a line B3-B4 cross-sectional view of FIG. 1.

As shown in FIG. 2A, the semiconductor memory device 110 according to the embodiment includes a stacked body SB, multiple first memory portions MP1, and multiple second memory portions MP2.

The stacked body SB includes multiple conductive layers 21 (a first conductive layer 21a, a second conductive layer 21b, etc.). The multiple conductive layers 21 are arranged in a first direction.

The first direction is taken as a Z-axis direction. One direction perpendicular to the first direction is taken as an X-axis direction. A direction perpendicular to the Z-axis direction and the X-axis direction is taken as a Y-axis direction.

The multiple conductive layers 21 extend in a second direction. The second direction crosses the first direction. In the example, the second direction is the X-axis direction.

An insulating layer 22 is provided between the multiple conductive layers 21. The multiple conductive layers 21 include, for example, a metal, etc. The insulating layer 22 includes, for example, an oxide (silicon oxide or the like), etc.

The stacked body SB is provided on, for example, a base body 10. The base body 10 may include, for example, at least a portion of a silicon substrate. For example, the first conductive layer 21a is provided between the second conductive layer 21b and the base body 10.

The stacked body SB includes multiple regions as shown in FIG. 2A and FIG. 1. The multiple regions are, for example, a first region Rx1, a second region Rx2, etc. The second region Rx2 is arranged with the first region in the second direction (in the example, the X-axis direction).

The multiple first memory portions MP1 extend in the first direction (the Z-axis direction) through the first region Rx1. The multiple first memory portions MP1 are arranged at a first pitch p1 along the second direction (the X-axis direction).

The multiple second memory portions MP2 extend in the first direction (the Z-axis direction) through the second region Rx2. The multiple second memory portions MP2 are arranged at the first pitch p1 along the second direction (the X-axis direction).

The multiple first memory portions MP1 and the multiple second memory portions MP2 are included in multiple memory portions MP. A portion of the multiple memory portions MP is provided in the first region Rx1. This portion corresponds to the multiple first memory portions MP1. Another portion of the multiple memory portions MP is provided in the second region Rx2. This portion corresponds to the multiple second memory portions MP2.

As shown in FIG. 2A, one of the multiple memory portions MP includes a semiconductor body 50 and a memory layer 54. The semiconductor body 50 extends in the Z-axis direction through the stacked body SB. The memory layer 54 is provided between the semiconductor body 50 and the multiple conductive layers 21. Memory cells MC are formed at the portions where the multiple conductive layers 21 and the multiple memory portions MP cross. The memory cells MC correspond to memory transistors. The multiple conductive layers 21 correspond to, for example, gate electrodes of the memory transistors. The semiconductor body 50 is used as the channels of the memory transistors. The multiple conductive layers 21 function as, for example, word lines. One end (e.g., the lower end) of the semiconductor body 50 is electrically connected to the base body 10. The one end of the semiconductor body 50 is electrically connected to, for example, a source line (not illustrated) via the base body 10. On the other hand, the other end (e.g., the upper end) of the semiconductor body 50 is connected to a bit line (not illustrated). A selection gate (not illustrated) is further provided at the semiconductor body 50. By the control of the word lines, the bit lines, and the selection gates, the multiple memory cells MC are selected; and the operations of programming, erasing, and reading are performed.

In the embodiment, the pitch of the multiple first memory portions MP1 is the same as the pitch of the multiple second memory portions MP2. In other words, the spacing of the multiple first memory portions MP1 is constant. Also, the spacing of the multiple second memory portions MP2 is constant. In the embodiment, the spacing between the group of the multiple first memory portions MP1 and the group of the multiple second memory portions MP2 is longer than the spacing inside each group.

In the embodiment as shown in FIG. 1, one M1 of the multiple first memory portions MP1 has a center (a first center C1) in the second direction. One of the multiple second memory portions MP2 has a center (a second center C2) in the second direction. A distance q1 along the second direction between the first center C1 and the second center C2 is longer than the first pitch p1. The distance q1 is shorter than 2 times the first pitch p1.

Among the multiple first memory portions MP1, the one M1 of the multiple first memory portions MP1 is most proximal to one M2 of the multiple second memory portions MP2. Among the multiple second memory portions MP2, the one M2 of the multiple second memory portions MP2 is most proximal to the one M1 of the multiple first memory portions MP1. For such a one M1 and such a one M2, the distance between the centers is set to be longer than the first pitch p1.

For example, the spacing of the multiple memory portions MP is set to be as small as possible inside one group. Thereby, the density of the memory cells MC can be set to be high inside one group. In such a case, the resistance of the conductive layer 21 becomes excessively high if the number of the multiple memory portions MP provided inside one group is excessively large.

On the other hand, as shown in FIG. 1, regions that have stripe configurations extending in the X-axis direction are provided at the ends of the conductive layer 21. The regions that have the stripe configurations are, for example, a sixth region Rx6, a seventh region Rx7, etc. In the example, a fifth region Rx5 (e.g., a separation region) is provided in the central region of the conductive layer 21. The fifth region Rx5 also extends in the X-axis direction. The memory portions MP are not provided in the fifth to seventh regions Rx5 to Rx7. Therefore, the resistance is low in these regions.

In the embodiment, the spacing between the group of the multiple first memory portions MP1 and the group of the multiple second memory portions MP2 is set to be longer than the spacing of the memory portions MP of each group. In other words, the distance q1 along the second direction between the first center C1 and the second center C2 is longer than the first pitch p1. Thereby, a region where the spacing between the multiple memory portions MP is long is provided. This region is electrically connected to, for example, the fifth to seventh regions Rx5 to Rx7 recited above. Thereby, the increase of the resistance of the conductive layer 21 can be suppressed.

As described below, there are cases where the multiple conductive layers 21 are formed by a replacement method. A stacked body is formed in the replacement method. The stacked body includes multiple first films (e.g., sacrificial layers), and second films provided between the multiple first films. Memory portions that pierce such a stacked film are formed. Then, the multiple first films are removed; and a material that is used to form the conductive layers 21 is introduced to the space formed by the removal. The multiple conductive layers 21 are formed of a conductive material. The multiple second films are used to form the insulating layers 22. By such a replacement method, the material that is used to form the conductive layers 21 is not easily introduced when forming the stacked body SB if the space between the multiple memory portions MP is excessively narrow. Thereby, for example, voids occur. If it is difficult to introduce the material, for example, the resistance of the conductive layer 21 increases.

In the embodiment, portions where the spacing of the multiple memory portions MP is wide are provided locally. Therefore, even in the case where the replacement method recited above is used, the material that is used to form the conductive layers 21 can be introduced via the portions where the spacing is locally wide. Because the spacing is wide, the material is introduced easily. For example, the occurrence of the voids can be suppressed locally.

Thus, in the embodiment, a special configuration is applied to the arrangement of the multiple memory portions MP. Thereby, for example, the increase of the resistance of the conductive layer 21 can be suppressed.

On the other hand, the density of the multiple memory portions MP decreases if the spacing of the portions where the spacing of the multiple memory portions MP is wide is set to be excessively large. In the embodiment, the distance q1 recited above is set to be shorter than 2 times the first pitch p1. Thereby, the decrease of the density of the multiple memory portions MP can be suppressed.

Thus, in the embodiment, the density of the multiple memory portions MP can be increased while maintaining a low resistance of the conductive layer 21. According to the embodiment, a semiconductor memory device can be provided in which the storage density can be increased.

In the embodiment, the number of the multiple first memory portions MP1 is not less than 3 and not more than 100. Similarly, the number of the multiple second memory portions MP2 is not less than 3 and not more than 100. In the example shown in FIG. 1, the numbers are 6. When the numbers are excessively small, the density of the multiple memory portions MP becomes excessively low. When the numbers exceed 100, for example, the resistance of the conductive layer 21 increases excessively. When the numbers exceed 100, for example, there are also cases where the resistance distribution along the Y-axis direction of the conductive layer 21 becomes excessively large.

As shown in FIG. 1 and FIG. 2B, multiple third memory portions MP3 and multiple fourth memory portions MP4 are further provided in the semiconductor memory device 110. The multiple third memory portions MP3 extend in the first direction (the Z-axis direction) through the first region Rx1. The multiple third memory portions MP3 are arranged at the first pitch p1 along the second direction (the X-axis direction).

The multiple fourth memory portions MP4 extend in the first direction (the Z-axis direction) through the second region Rx2. The multiple fourth memory portions MP4 are arranged at the first pitch p1 along the second direction (the X-axis direction).

One M3 of the multiple third memory portions MP3 has a center (a third center C3) in the second direction (the X-axis direction). One M4 of the multiple fourth memory portions MP4 has a center (a fourth center C4) in the second direction (the X-axis direction). A distance q2 along the second direction (the X-axis direction) between the third center C3 and the fourth center C4 is longer than the first pitch p1 and shorter than 2 times the first pitch p1.

Thereby, for example, even in the region where the multiple third memory portions MP3 and the multiple fourth memory portions MP4 are provided, the density of the memory portions MP can be increased while maintaining a low resistance of the conductive layer 21.

In the example, the one M3 of the multiple third memory portions MP3 recited above is provided at a position along a direction from the one M1 of the multiple first memory portions MP1 recited above that is tilted with respect to the X-axis direction. The one M4 of the multiple fourth memory portions MP4 recited above is provided at a position along a direction from the one M2 of the multiple second memory portions MP2 recited above that is tilted with respect to the X-axis direction.

For example, the position in the second direction of the first center C1 is between the position in the second direction of the third center C3 and the position in the second direction of the fourth center C4. For example, the position in the second direction of the fourth center C4 is between the position in the second direction of the first center C1 and the position in the second direction of the second center C2.

For example, a direction that crosses the first direction and the second direction is taken as a third direction. The third direction is, for example, the Y-axis direction. A distance p2 along the third direction between the position of the first center C1 in the third direction and the position of the third center C3 in the third direction is shorter than the first pitch p1. The density of the multiple memory portions MP can be increased further by setting the spacing of the multiple memory portions MP in the Y-axis direction to be small.

As shown in FIG. 1, multiple fifth memory portions MP5 and multiple sixth memory portions MP6 are further provided. The stacked body SB further includes a third region Rx3 and a fourth region Rx4 in addition to the fifth region Rx5 described above. The third region Rx3 is arranged with the first region Rx1 in the third direction (e.g., the Y-axis direction) crossing the first direction and the second direction. The fourth region Rx4 is arranged with the third region Rx3 in the second direction (the X-axis direction) and arranged with the second region Rx2 in the third direction (the Y-axis direction).

The fifth region Rx5 is positioned between the first region Rx1 and the third region Rx3 and between the second region Rx2 and the fourth region Rx4.

The multiple fifth memory portions MP5 extend in the first direction through the third region Rx3 and are arranged at the first pitch p1 along the second direction. The multiple sixth memory portions MP6 extend in the first direction through the fourth region Rx4 and are arranged at the first pitch p1 along the second direction.

The fifth region Rx5 is continuous in the second direction (the X-axis direction). For example, the fifth region Rx5 is continuous when cut by a plane (the Z-X plane) including the first direction and the second direction. On the other hand, the multiple memory portions MP are provided in the first to fourth regions Rx1 to Rx4. Therefore, the first to fourth regions Rx1 to Rx4 are discontinuous in the second direction (the X-axis direction). For example, the first to fourth regions Rx1 to Rx4 are discontinuous when cut by the Z-X plane. The fifth region Rx5 is a region (e.g., a separation region) where the memory portions MP are not provided.

For example, a width w5 along the third direction (e.g., the Y-axis direction) of the fifth region Rx5 is, for example, longer than the distance q1 described above. For example, the width w5 may be larger than, for example, the first pitch p1. In the embodiment, the width w5 may be shorter than the distance q1. The width w5 may be smaller than the first pitch p1.

By providing such a fifth region Rx5 (the region where the memory portions MP are not provided), the resistance of the conductive layer 21 can be maintained to be low.

As shown in FIG. 1, the sixth region Rx6 and the seventh region Rx7 may be further provided in the stacked body SB.

The first to fifth regions Rx1 to Rx5 are positioned between the sixth region Rx6 and the seventh region Rx7.

The sixth region Rx6 is continuous in the second direction. The sixth region Rx6 is continuous when cut by the Z-X plane. The sixth region Rx6 is a region where the memory portions MP are not provided. The seventh region Rx7 is continuous in the second direction. The seventh region Rx7 is continuous when cut by the Z-X plane. The seventh region Rx7 is a region where the memory portions MP are not provided. By providing such a sixth region Rx6 and such a seventh region Rx7, the resistance of the conductive layer 21 can be maintained to be low.

For example, the sixth region Rx6 and the seventh region Rx7 are electrically connected via the fifth region Rx5. The electrical connection is performed by, for example, a region between the first region Rx1 and the second region Rx2 (a region having a wide width where the memory portions MP are not provided). For example, the memory portions MP are provided at high density in the first region Rx1, the second region Rx2, the third region Rx3, and the fourth region Rx4. The fifth region Rx5, the sixth region Rx6, and the seventh region Rx7 are provided around these regions. The resistance of the conductive layer 21 is low in these regions. The resistance of the conductive layer 21 can be maintained to be low by such a structure.

As shown in FIG. 1, a set of the multiple conductive layers 21 such as that recited above is arranged in the Y-axis direction. For example, the conductive layer 21 recited above is provided between another conductive layer 21A and another conductive layer 21B. The other conductive layer 21A and the other conductive layer 21B also extend in the X-axis direction. A first conductive portion 57A is provided between the other conductive layer 21A and the conductive layer 21. An insulating portion 57i is provided between the other conductive layer 21A and the first conductive portion 57A. Another insulating portion 57i is provided between the conductive layer 21 and the first conductive portion 57A. A second conductive portion 57B is provided between the other conductive layer 21B and the conductive layer 21. Another insulating portion 57i is provided between the other conductive layer 21B and the first conductive portion 57A. Another insulating portion 57i is provided between the conductive layer 21 and the second conductive portion 57B.

The first conductive portion 57A and the second conductive portion 57B extend in the X-axis direction. These conductive portions may spread, for example, along the X-axis direction and the Z-axis direction. For example, one end of each of these conductive portions is electrically connected to the base body 10. For example, the other end of each of these conductive portions is electrically connected to the source line (not illustrated). These conductive portions are, for example, source line members.

An example of the memory portions MP will now be described.

Figure 3:
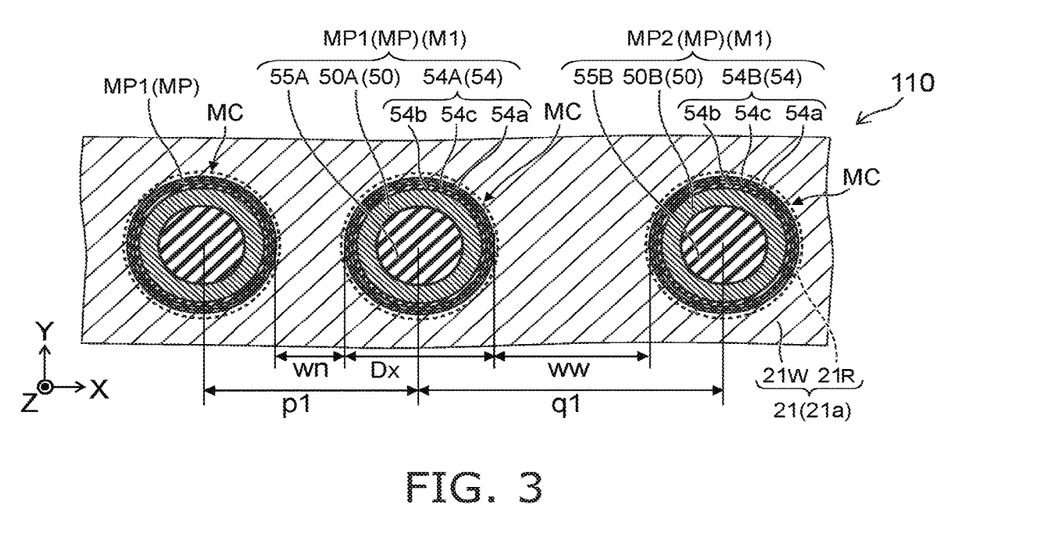
FIG. 3 is a schematic cross-sectional view illustrating the semiconductor memory device according to the first embodiment.

FIG. 3 is a schematic cross-sectional view illustrating the semiconductor memory device according to the first embodiment.

FIG. 3 is a schematic cross-sectional view in which a portion of FIG. 1 is enlarged.

One of the multiple first memory portions MP1 (the one M1 recited above) includes the semiconductor body 50 (50A), a first memory insulating film 54a, a second memory insulating film 54b, and a memory film 54c. The semiconductor body 50 (50A) extends in the first direction (the Z-axis direction) through the stacked body SB (referring to FIG. 2A). The first memory insulating film 54a is provided between the semiconductor body 50 (50A) and the multiple conductive layers 21 (e.g., the first conductive layer 21a). The second memory insulating film 54b is provided between the semiconductor body 50 (50A) and the first memory insulating film 54a. The memory film 54c is provided between the first memory insulating film 54a and the second memory insulating film 54b. The first memory insulating film 54a, the second memory insulating film 54b, and the memory film 54c are included in the memory layer 54 (a memory layer 54A). The first memory insulating film 54a corresponds to, for example, a blocking insulating film. The second memory insulating film 54b corresponds to, for example, a tunneling insulating film. These insulating films include, for example, silicon oxide, etc. The memory film 54c is, for example, a charge storage film. In such a case, the memory film 54c includes, for example, silicon nitride, etc. The memory film 54c may be a floating gate. In such a case, the memory film 54c includes, for example, polysilicon, etc.

One of the multiple second memory portions MP2 (the one M2 recited above) has a configuration similar to that of the one of the multiple first memory portions MP1 (the one M1 recited above). The one M2 recited above includes, for example, the semiconductor body 50 (50B) and a memory layer 54B.

As shown in FIG. 3, the semiconductor body 50A and the semiconductor body 50B may have pipe configurations. For example, core portions 55A and 55B that extend in the first direction (the Z-axis direction) are provided. The semiconductor body 50A is provided between the core portion 55A and the conductive layers 21 (the stacked body SB). The semiconductor body 50B is provided between the core portion 55B and the conductive layers 21 (the stacked body SB).

As described above, the multiple first memory portions MP1 are arranged at a substantially constant pitch (the first pitch p1). A length Dx in the second direction of each of the multiple first memory portions MP1 is substantially constant. In such a case, a distance wn (the spacing) between two of the multiple first memory portions MP1 is substantially constant.

Similarly, the multiple second memory portions MP2 are arranged at a substantially constant pitch (the first pitch p1). The length in the second direction of each of the multiple second memory portions MP2 also is set to be the length Dx. In such a case, for the multiple second memory portions MP2 as well, the distance (the spacing) is the distance wn and is substantially constant.

In the example, one size (the length Dx) of the multiple memory portions MP is longer than the distance wn. For example, the length Dx in the second direction of the one M1 of the multiple first memory portions MP1 recited above is longer than ½ of the first pitch p1. For example, the shortest distance along the second direction between two of the multiple first memory portions MP1 is shorter than ½ of the first pitch p1. The shortest distance corresponds to the distance wn.

On the other hand, a distance ww along the second direction between the one M1 of the multiple first memory portions MP1 recited above and the one M2 of the multiple second memory portions MP2 recited above is longer than the distance wn recited above (the shortest distance along the second direction between two of the multiple first memory portions MP1). Thus, by setting the distance ww along the second direction between the one M1 of the multiple first memory portions MP1 recited above and the one M2 of the multiple second memory portions MP2 recited above to be longer than the distance wn of the other portions, the storage density can be increased while suppressing the increase of the resistance of the conductive layer 21.

For example, the width w5 along the third direction (e.g., the Y-axis direction) of the fifth region Rx5 is greater than 2 times the distance wn (the distance along the second direction) between the two of the multiple first memory portions MP1. For example, the width w5 may be longer than the length Dx in the second direction (the X-axis direction) of the one of the multiple first memory portions MP1. The width w5 may be, for example, longer than the length in the Y-axis direction (the third direction crossing the first direction and the second direction) of the one of the multiple first memory portions MP1.

In the example, one of the multiple conductive layers 21 (e.g., the first conductive layer 21a) includes a first portion 21W and a second portion 21R. The second portion 21R is provided between the first portion 21W and each of the multiple memory portions MP. The first portion 21W includes, for example, tungsten. The second portion 21R includes, for example, TiN. The second portion 21R functions as, for example, a barrier metal.

An example of a method for manufacturing the semiconductor memory device 110 will now be described.

FIG. 4A to FIG. 4E and FIG. 5A to FIG. 5E are schematic cross-sectional views illustrating the method for manufacturing the semiconductor memory device according to the first embodiment.

Figure 4A:
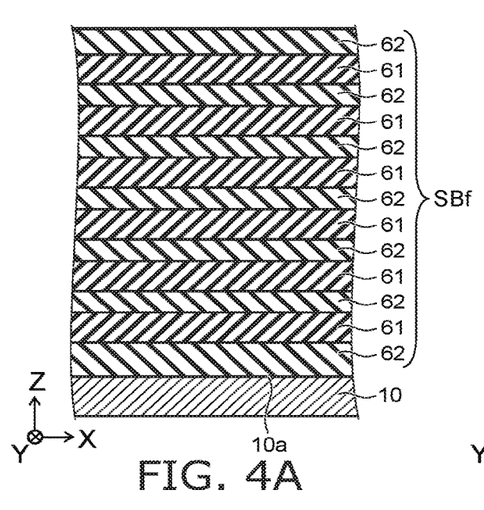
FIG. 4A to FIG. 4E are schematic cross-sectional views illustrating a method for manufacturing the semiconductor memory device according to the first embodiment.
Figure 4B:
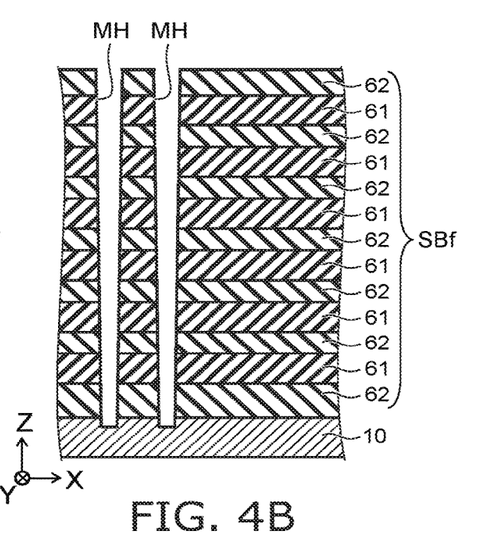

As shown in FIG. 4A, a stacked film SBf is formed on a surface 10a (e.g., the upper surface) of the base body 10. A direction that is perpendicular to the surface 10a of the base body 10 corresponds to the first direction (the Z-axis direction). The stacked film SBf includes multiple first films 61 arranged in the Z-axis direction, and a second film 62 provided between the multiple first films 61. The first films 61 are, for example, silicon nitride films. The second films 62 are, for example, silicon oxide films. As described below, the stacked body SB is formed from the stacked film SBf.

Figure 4C:
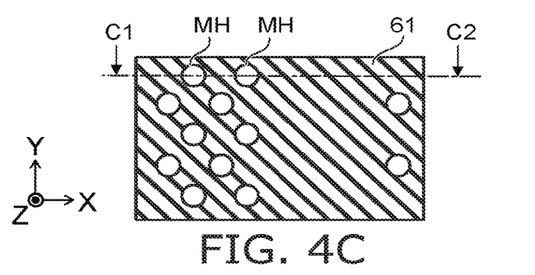

As shown in FIG. 4A and FIG. 4C, multiple memory holes MH are formed in the stacked film SBf. The multiple memory holes MH pierce the stacked film SBf in the Z-axis direction. For example, the multiple memory holes MH reach the base body 10. As described below, the memory portions MP are formed at the positions of the multiple memory holes MH. Accordingly, the positions of the multiple memory holes MH are set to be, for example, the positions of the multiple memory portions MP described in reference to FIG. 1.

Figure 4D:
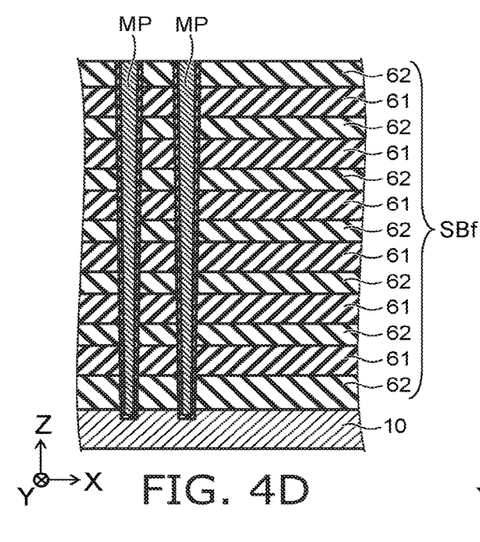

As shown in FIG. 4D, for example, a silicon oxide film, a silicon nitride film, and a silicon oxide film are sequentially formed in the multiple memory holes MH; and a silicon film is formed in the remaining space. The silicon oxide film, the silicon nitride film, and the silicon oxide film are used to form at least a portion of the memory layer 54. One of the two silicon oxide films is used to form at least a portion of the first memory insulating film 54a. The other one of the two silicon oxide films is used to form the second memory insulating film 54b. The silicon nitride film is used to form the memory film 54c. The silicon film is used to form the semiconductor body 50. The insulating film may be formed in the remaining space after the formation of the silicon film. The insulating films are used to form the core portions 55A and 55B, etc.

Thus, the multiple first memory portions MP1 and the multiple second memory portions MP2 are formed (referring to FIG. 1). The multiple first memory portions MP1 extend in the first direction (the Z-axis direction) through the first region Rx1 of the stacked film SBf and are arranged at the first pitch p1 in the second direction (the X-axis direction) crossing the first direction (referring to FIG. 1 and FIG. 2A). The multiple second memory portions MP2 extend in the first direction (the Z-axis direction) through the second region Rx2 of the stacked film SBf and are arranged at the first pitch p1 in the second direction (the X-axis direction) (referring to FIG. 1 and FIG. 2A). The second region Rx2 is arranged with the first region Rx1 in the second direction. The distance q1 along the second direction between the first center C1 in the second direction of the one M1 of the multiple first memory portions MP1 and the second center C2 in the second direction of the one M2 of the multiple second memory portions MP2 is longer than the first pitch p1 (referring to FIG. 1). The distance q1 is shorter than 2 times the first pitch p1 (referring to FIG. 1).

Figure 4E:
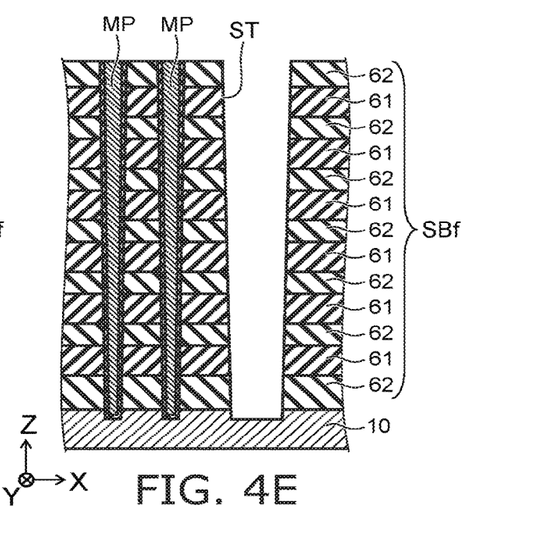

A hole ST is formed in the stacked film SBf as shown in FIG. 4E. In the example, the hole ST is a slit. The hole ST spreads along the Z-Y plane. The hole ST reaches the base body 10.

Figure 5A:
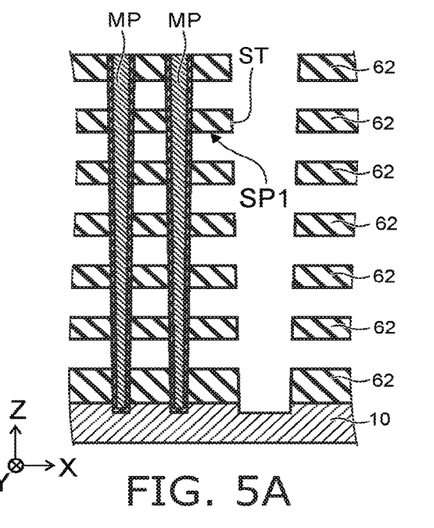
FIG. 5A to FIG. 5E are schematic cross-sectional views illustrating a method for manufacturing the semiconductor memory device according to the first embodiment.
Figure 5B:
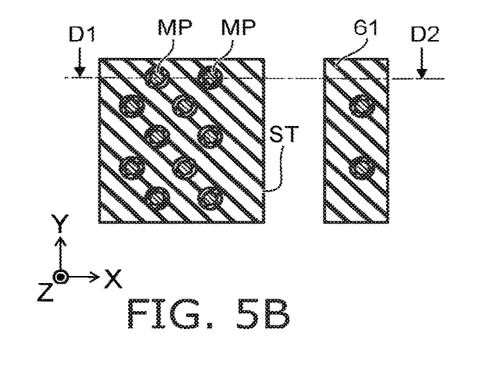

As shown in FIG. 5A and FIG. 5B, the multiple first films 61 are removed via the hole ST.

Figure 5C:
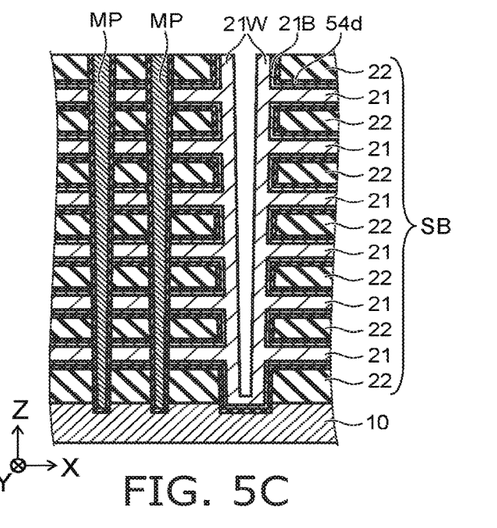

As shown in FIG. 5C, a material that is used to form the conductive layers 21 is introduced to a space SP1 formed where the multiple first films 61 are removed. For example, a foundation film 54d (e.g., an aluminum oxide film) is formed; the second portion 21R of the conductive layer 21 (e.g., a TiN film) is formed; and the first portion 21W of the conductive layer 21 (e.g., a tungsten film) is formed. The formations of these films include, for example, CVD (Chemical Vapor Deposition), etc. Thereby, the multiple conductive layers 21 are formed. The second films 62 are used to form the insulating layers 22.

Figure 5D:
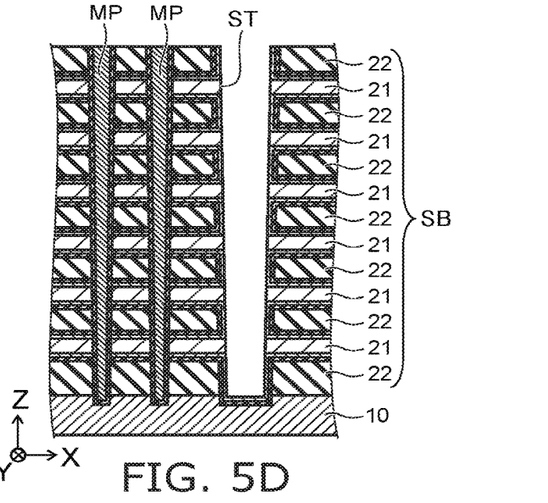
Figure 5E:
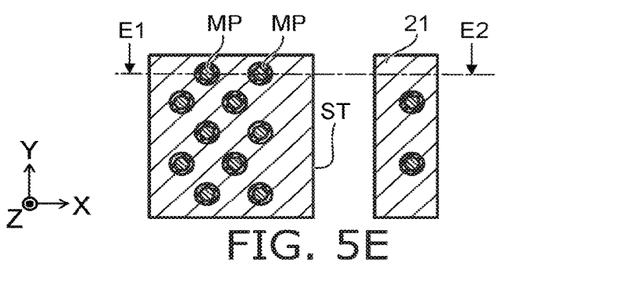

As shown in FIG. 5D and FIG. 5E, the TiN film and the tungsten film recited above that are formed at the portion of the hole ST are removed by etch-back. Subsequently, the insulating portion 57i and the conductive portion (the first conductive portion 57A, the second conductive portion 57B, etc.) are formed on the surface of the hole ST. Further, the interconnects, etc., are formed; and the semiconductor memory device 110 is formed.

Figure 6A:
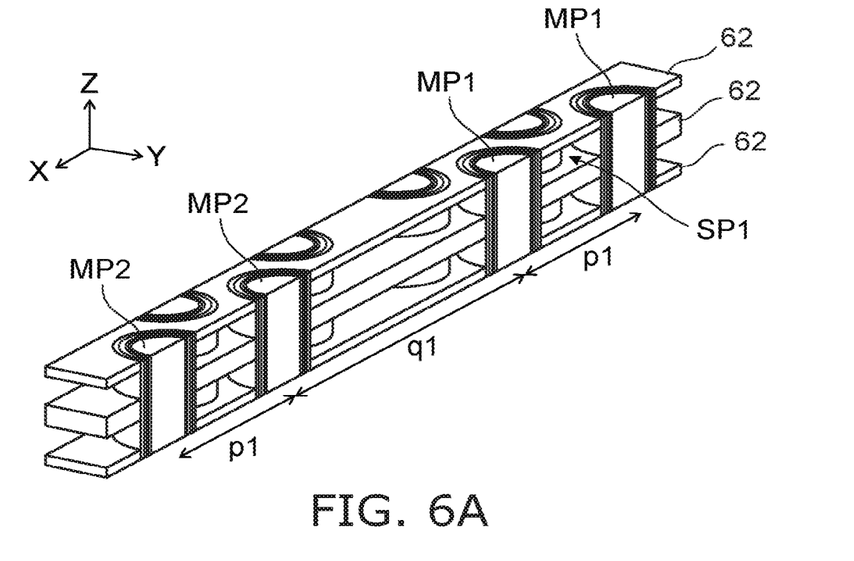
FIG. 6A and FIG. 6B are schematic perspective views illustrating states partway through the manufacturing of the semiconductor memory device according to the first embodiment.
Figure 6B:
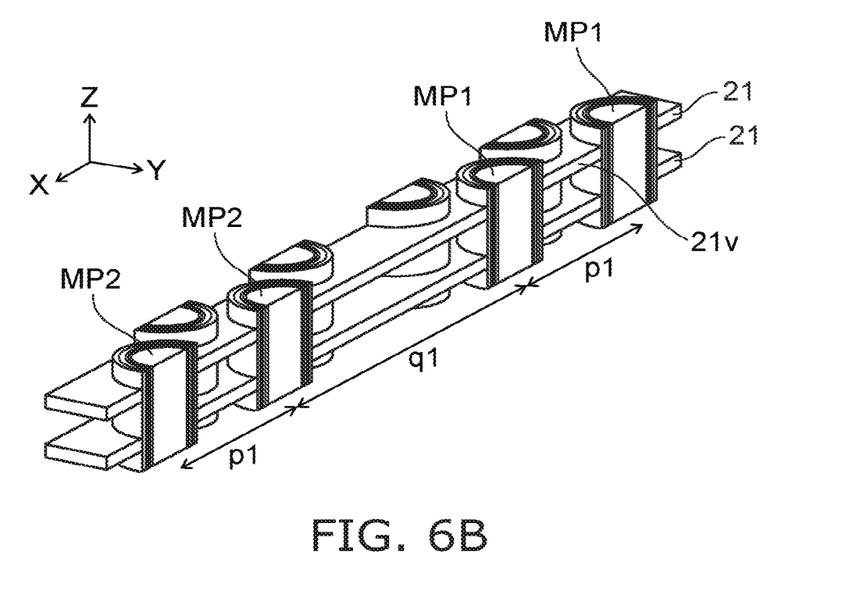

FIG. 6A and FIG. 6B are schematic perspective views illustrating states partway through the manufacturing of the semiconductor memory device according to the first embodiment.

FIG. 6A illustrates the state after the process of FIG. 5A and prior to the process of FIG. 5C. FIG. 6B illustrates the state after the process of FIG. 5D. In FIG. 6B, the second film 62 (the insulating layer 22) is not illustrated for easier viewing of the drawing.

As shown in FIG. 6A, the multiple first films 61 are removed; and the space SP1 is formed. As shown in FIG. 6B, the conductive layers 21 are formed by introducing, to the space SP1, a material used to form the conductive layers 21. At this time, a film of this material is grown from the wall surface of the space SP1. There are cases where the space SP1 is partially plugged by the film of this material. Thereby, there are cases where a void 21v is formed. The plugging occurs easily at portions where the cross-sectional area is small where the material (the gas) passes through.

For example, in the conductive layer 21 illustrated in FIG. 1, the void 21v occurs easily in the regions where the multiple memory portions MP are provided. On the other hand, the void 21v does not occur easily in the regions (the fifth to seventh regions Rx5 to Rx7, etc.) where the memory portions MP are not provided. The distance between the sixth region Rx6 and the hole ST (the first conductive portion 57A and the second conductive portion 57B) and the distance between the seventh region Rx7 and the hole ST are short. Therefore, the void 21v does not occur easily particularly in the sixth region Rx6 and the seventh region Rx7.

For example, one of the multiple conductive layers 21 (e.g., the first conductive layer 21a) includes a portion included in the sixth region Rx6 and a portion included in the first region Rx1. The density of the voids 21v in the portion included in the sixth region Rx6 is lower than the density of the voids 21v in the portion included in the first region Rx1. Or, the portion included in the sixth region Rx6 does not include the void 21v. For example, the ratio of the volume of the void 21v in the portion included in the sixth region Rx6 to the volume of the portion included in the sixth region Rx6 is lower than the ratio of the volume of the void 21v in the portion included in the first region Rx1 to the volume of the portion included in the first region Rx1.

For example, the one of the multiple conductive layers 21 (e.g., the first conductive layer 21a) further includes a portion included in the fifth region Rx5. The density of the voids 21v in the portion included in the fifth region Rx5 is lower than the density of the voids 21v in the portion included in the first region Rx1. Or, the portion included in the fifth region Rx5 does not include the void 21v. The ratio of the volume of the void 21v in the portion included in the fifth region Rx5 to the volume of the portion included in the fifth region Rx5 is lower than the ratio of the volume of the void 21v in the portion included in the first region Rx1 to the volume of the portion included in the first region Rx1.

Figure 7A:
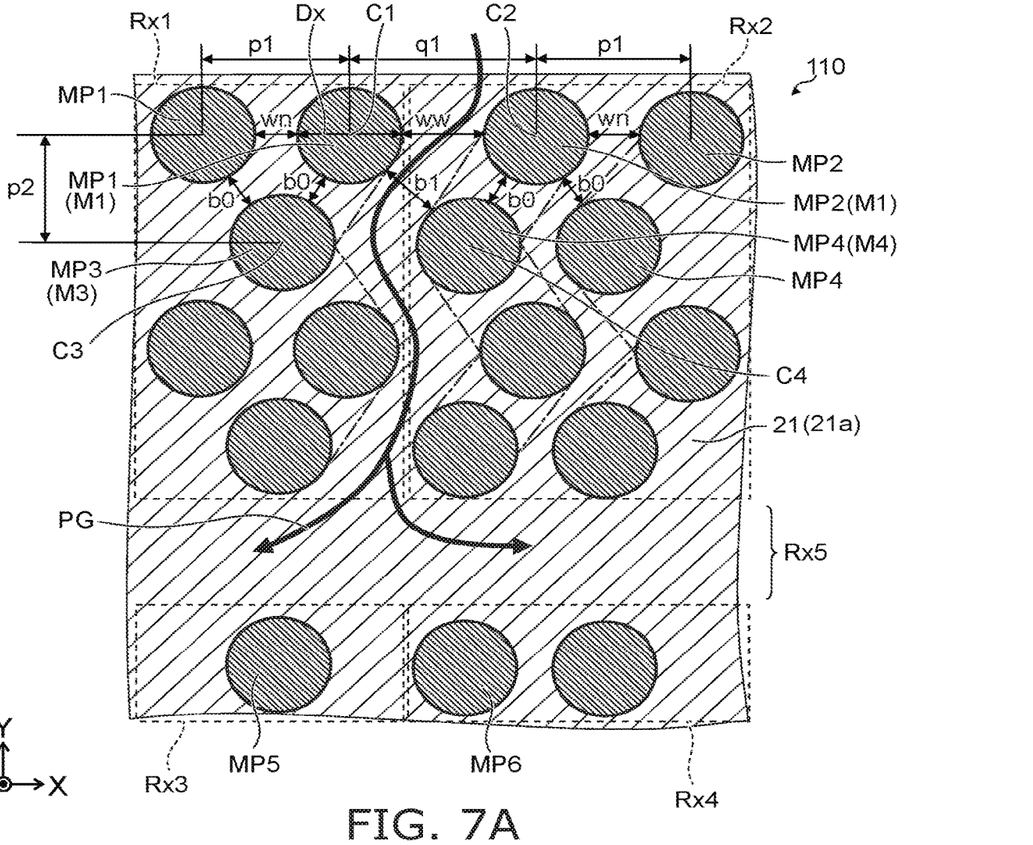
FIG. 7A and FIG. 7B are schematic cross-sectional views illustrating the semiconductor memory device according to the first embodiment.
Figure 7B:
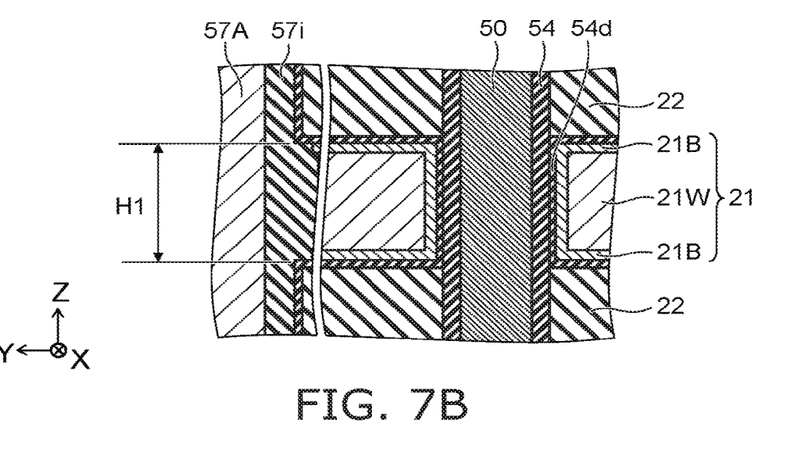

FIG. 7A and FIG. 7B are schematic cross-sectional views illustrating the semiconductor memory device according to the first embodiment.

As shown in FIG. 7A, the distance q1 between the first center C1 of the one M1 of the multiple first memory portions MP1 and the second center C2 of the one M2 of the multiple second memory portions MP2 is larger than the first pitch p1 and smaller than 2 times the first pitch p1.

The distance ww along the second direction between the one M1 of the multiple first memory portions MP1 recited above and the one M2 of the multiple second memory portions MP2 recited above is longer than the shortest distance (the distance wn) along the second direction between two of the multiple first memory portions MP1. The shortest distance (the distance wn) is, for example, shorter than ½ of the first pitch p1.

On the other hand, as shown in FIG. 7B, the length (the thickness) along the first direction (the Z-axis direction) of one of the multiple conductive layers 21 is taken as a thickness H1. For example, in the case where the conductive layers 21 are formed by a replacement method such as that recited above, the height of an inflow path PG of the material (the gas) used to form the conductive layers 21 (referring to FIG. 7A) corresponds to the thickness H1 recited above.

In the embodiment, the distance ww is longer than the thickness H1 along the first direction (the Z-axis direction) of the one of the multiple conductive layers 21. Thereby, the void 21v is not formed easily. On the other hand, the shortest distance (the distance wn) along the second direction between two of the multiple first memory portions MP1 is not more than the thickness H1. Thereby, the multiple first memory portions MP1 can be arranged at high density. In such a case, there are cases where the void 21v is formed in the conductive layer 21 between the multiple first memory portions MP1. The practical problem of the increase of the resistance of the conductive layer 21 due to the void 21v can be suppressed by setting the number of the multiple first memory portions MP1 to an appropriate value.

In the embodiment, it is favorable for $ww > H1$. It is favorable for $wn \leq H1$. In the embodiment, $ww \geq H1$ and $wn < H1$ are possible. Considering the fluctuation of the processes, it is favorable for $ww > (1.2 \times H1)$. It is favorable for wn $(1.2 \times H1)$. In the embodiment, $ww \geq (1.2 \times H1)$ and $wn < (1.2 \times H1)$ are possible. Thereby, the density of the multiple memory portions MP can be increased while suppressing the increase of the resistance of the multiple conductive layers 21 due to the void 21v to be in a practical range.

On the other hand, a distance b1 between the one M1 of the multiple first memory portions MP1 recited above and the one M4 of the multiple fourth memory portions MP4 recited above is longer than a distance b0 between the one M1 of the multiple first memory portions MP1 recited above and the one M3 of the multiple third memory portions MP3 recited above. The distance b0 corresponds to the distance between the one M2 of the multiple second memory portions MP2 recited above and the one M4 of the multiple fourth memory portions MP4 recited above.

For example, in the embodiment, it is favorable for $b1 > H1$. It is favorable for $b0 \leq H1$. In the embodiment, $b1 \geq H1$ and $b0 < H1$ are possible. For example, considering the fluctuation of the processes, it is favorable for $b1 > (1.2 \times H1)$. It is favorable for $b0 < (1.2 \times H1)$. In the embodiment, $b1 \geq (1.2 \times H1)$ and $b0 < (1.2 \times H1)$ are possible. Thereby, the density of the multiple memory portions MP can be increased while suppressing the increase of the resistance of the multiple conductive layers 21 due to the void 21v to be in a practical range.

For example, the first pitch p1 is taken as P1. On the other hand, the distance along the third direction between the position of the first center C1 in the third direction (a direction crossing the first direction and the second direction, e.g., the Y-axis direction) and the position of the third center C3 in the third direction is taken as P2. The length in the second direction (the X-axis direction) of the one M1 of the multiple first memory portions MP1 recited above is taken as Dx.

In the embodiment, the distance b0 recited above is represented by $$b0 = [((P1)/2)^2 + (P2)^2]^{1/2} - Dx.$$

In such a case, it is favorable for the distance b0 to be less than 1.2 times the thickness H1 along the first direction of the one of the multiple conductive layers 21.

The difference between the distance (the distance ww) along the second direction between the one M1 of the multiple first memory portions MP1 recited above and the one M2 of the multiple second memory portions MP2 recited above and the shortest distance (the distance wn) along the second direction between two of the multiple first memory portions MP1 is taken as Pd.

In the embodiment, the distance b1 recited above is represented by $$b1 = [((P1+Pd)/2)^2 + (P2)^2]^{1/2} - Dx.$$

In the embodiment, it is favorable for the distance b1 to be greater than 1.2 times the thickness H1 recited above.

In the embodiment, for example, the relationship between the spacing (for example, the distance wn, and/or for example, the distance ww) between the multiple memory portions MP and the thickness H1 of the conductive layer 21 is determined appropriately. For example, plugging of the space between the multiple memory portions MP before the filling of the fifth region Rx5 is completed is suppressed. The occurrence of the void 21v in the fifth region Rx5 is suppressed. The increase of the resistance of the fifth region Rx5 is suppressed.

Figure 8:
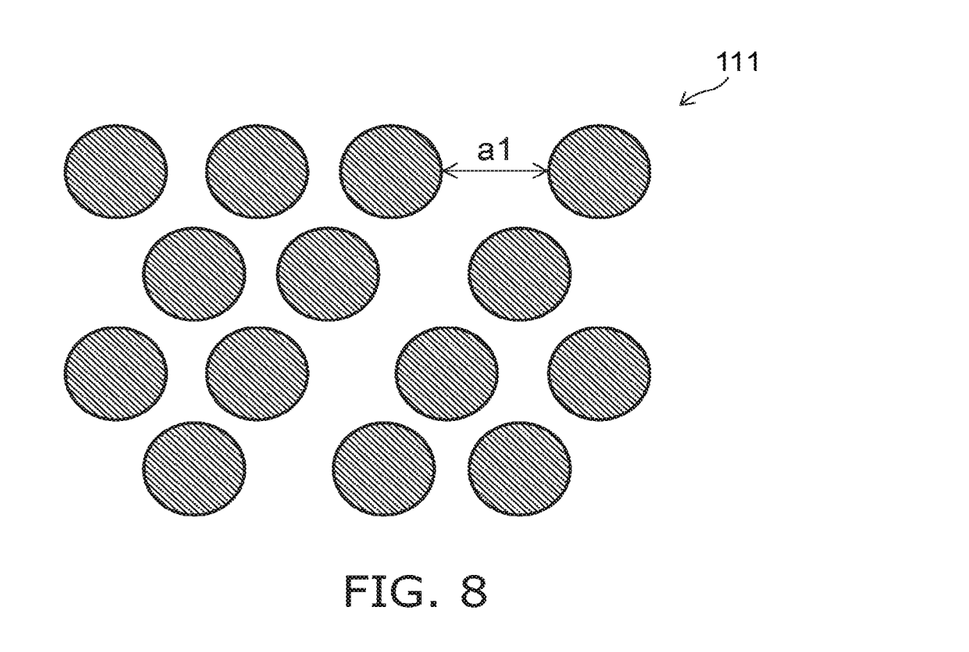
FIG. 8 is a schematic cross-sectional view illustrating another semiconductor memory device according to the first embodiment.

FIG. 8 is a schematic cross-sectional view illustrating another semiconductor memory device according to the first embodiment.

As shown in FIG. 8, in the other semiconductor memory device 111 according to the embodiment as well, the distance q1 along the second direction between the first center C1 in the second direction (the X-axis direction) of the one M1 of the multiple first memory portions MP1 and the second center C2 in the second direction of the one M2 of the multiple second memory portions MP2 is longer than the first pitch p1 and shorter than 2 times the first pitch p1. In the semiconductor memory device 111, the distance p2 along the third direction (a direction crossing the first direction and the second direction, e.g., the Y-axis direction) between the position of the first center C1 in the third direction and the position of the third center C3 in the third direction is the same as the first pitch p1. Otherwise, the semiconductor memory device 111 is similar to the semiconductor memory device 110; and a description is therefore omitted. In the semiconductor memory device 111 as well, a semiconductor memory device can be provided in which the storage density can be increased.

Second Embodiment

The embodiment relates to a method for manufacturing the semiconductor memory device.

The manufacturing method includes, for example, at least a portion of the processing described in reference to FIG. 4A to FIG. 4E and FIG. 5A to FIG. 5E.

In the manufacturing method, for example, the stacked film SBf that includes the multiple first films 61 arranged in the first direction (the Z-axis direction) perpendicular to the surface 10a of the base body 10 and the second film 62 provided between the multiple first films 61 is formed on the surface 10a (referring to FIG. 4A).

The multiple first memory portions MP1 and the multiple second memory portions MP2 are formed (referring to FIG. 1 and FIG. 4D). The multiple first memory portions MP1 extend in the first direction (the Z-axis direction) through the first region Rx1 of the stacked film SBf and are arranged at the first pitch p1 in the second direction (the X-axis direction) crossing the first direction (referring to FIG. 1 and FIG. 2A). The multiple second memory portions MP2 extend in the first direction (the Z-axis direction) through the second region Rx2 of the stacked film SBf and are arranged at the first pitch p1 in the second direction (the X-axis direction) (referring to FIG. 1 and FIG. 2A). The second region Rx2 is arranged with the first region Rx1 in the second direction. The distance q1 along the second direction between the first center C1 in the second direction of the one M1 of the multiple first memory portions MP1 and the second center C2 in the second direction of the one M2 of the multiple second memory portions MP2 is longer than the first pitch p1 (referring to FIG. 1). The distance q1 is shorter than 2 times the first pitch p1 (referring to FIG. 1).

The hole ST is formed in the stacked film SBf (referring to FIG. 4E). Further, the multiple first films 61 are removed via the hole ST (referring to FIG. 5A).

The material that is used to form the conductive layers 21 is introduced to the space SP1 formed where the multiple first films 61 are removed (referring to FIG. 5C).

According to the manufacturing method, a method for manufacturing a semiconductor memory device can be provided in which the storage density can be increased.

The embodiment may include, for example, the following configurations.

Configuration 1

A semiconductor memory device, including:

a stacked body including multiple conductive layers arranged in a first direction, the multiple conductive layers extending in a second direction crossing the first direction, the stacked body including a first region and a second region, the second region being arranged with the first region in the second direction;

multiple first memory portions extending in the first direction through the first region and being arranged at a first pitch along the second direction; and multiple second memory portions extending in the first direction through the second region and being arranged at the first pitch along the second direction, a distance along the second direction between a first center in the second direction of one of the multiple first memory portions and a second center in the second direction of one of the multiple second memory portions being longer than the first pitch and shorter than 2 times the first pitch.

Configuration 2

The semiconductor memory device according to Configuration 1, wherein number of the multiple first memory portions is not less than 3 and not more than 100.

Configuration 3

The semiconductor memory device according to Configuration 1 or 2, wherein a distance along the second direction between the one of the multiple first memory portions and the one of the multiple second memory portions is not less than 1.2 times a thickness along the first direction of one of the multiple conductive layers.

Configuration 4

The semiconductor memory device according to Configuration 3, wherein a shortest distance along the second direction between two of the multiple first memory portions is shorter than 1.2 times the thickness.

Configuration 5

The semiconductor memory device according to Configuration 1 or 2, wherein the distance along the second direction between the one of the multiple first memory portions and the one of the multiple second memory portions is longer than a shortest distance along the second direction between two of the multiple first memory portions.

Configuration 6

The semiconductor memory device according to any one of Configurations 1 to 5, further including:

multiple third memory portions extending in the first direction through the first region and being arranged at the first pitch along the second direction; and multiple fourth memory portions extending in the first direction through the second region and being arranged at the first pitch along the second direction, a distance along the second direction between a third center in the second direction of one of the multiple third memory portions and a fourth center in the second direction of one of the multiple fourth memory portions being longer than the first pitch and shorter than 2 times the first pitch.

Configuration 7

The semiconductor memory device according to Configuration 6, wherein a position in the second direction of the first center is between a position in the second direction of the third center and a position in the second direction of the fourth center.

Configuration 8

The semiconductor memory device according to Configuration 7, wherein the position in the second direction of the fourth center is between the position in the second direction of the first center and a position in the second direction of the second center.

Configuration 9

The semiconductor memory device according to any one of Configurations 6 to 8, wherein a distance along the third direction crossing the first direction and the second direction between the position of the first center in the third direction and the position of the third center in the third direction is shorter than the first pitch.

Configuration 10

The semiconductor memory device according to any one of Configurations 6 to 9, wherein $$b0=[((P1)/2)^2+(P2)^2]^{1/2}-Dx, \text{ and}$$

b0 is less than 1.2 times the thickness along the first direction of one of the multiple conductive layers, where P1 is the first pitch, P2 is the distance along the third direction crossing the first direction and the second direction between the position of the first center in the third direction and the position of the third center in the third direction, and Dx is the length in the second direction of the one of the multiple first memory portions.

Configuration 11

The semiconductor memory device according to Configuration 10, wherein $$b1=[((P1+Pd)/2)^2+(P2)^2]^{1/2}-Dx, \text{ and}$$

b1 is not less than 1.2 times the thickness, where

Pd is the difference between the distance along the second direction between the one of the multiple first memory portions and the one of the multiple second memory portions and the shortest distance along the second direction between the two of the multiple first memory portions.

Configuration 12

The semiconductor memory device according to any one of Configurations 1 to 11, further including:

multiple fifth memory portions; and multiple sixth memory portions, the stacked body further including a third region, a fourth region, and a fifth region, the third region being arranged with the first region in the third direction crossing the first direction and the second direction, the fourth region being arranged with the third region in the second direction and arranged with the second region in the third direction, the fifth region being positioned between the first region and the third region and between the second region and the fourth region, the multiple fifth memory portions extending in the first direction through the third region and being arranged at the first pitch along the second direction, the multiple sixth memory portions extending in the first direction through the fourth region and being arranged at the first pitch along the second direction, the fifth region being continuous in the second direction.

Configuration 13

The semiconductor memory device according to Configuration 12, wherein a width along the third direction of the fifth region is greater than a distance between two of the multiple first memory portions.

Configuration 14

The semiconductor memory device according to Configuration 12 or 13, wherein the stacked body further includes a sixth region and a seventh region, the first to fifth regions are positioned between the sixth region and the seventh region, the sixth region is continuous in the second direction, and the seventh region is continuous in the second direction.

Configuration 15

The semiconductor memory device according to Configuration 14, wherein one of the multiple conductive layers includes a portion included in the sixth region and a portion included in the first region, and the ratio of a volume of a void in the portion included in the sixth region to a volume of the portion included in the sixth region is lower than the ratio of a volume of a void in the portion included in the first region to a volume of the portion included in the first region, or the portion included in the sixth region does not include a void.

Configuration 16

The semiconductor memory device according to Configuration 15, wherein the one of the multiple conductive layers further includes a portion included in the fifth region, and the ratio of a volume of a void in the portion included in the fifth region to a volume of the portion included in the fifth region is lower than the ratio of the volume of the void in the portion included in the first region to the volume of the portion included in the first region, or the portion included in the fifth region does not include a void.

Configuration 17

The semiconductor memory device according to any one of Configurations 1 to 16, wherein a length in the second direction of the one of the multiple first memory portions is longer than ½ of the first pitch.

Configuration 18

The semiconductor memory device according to any one of Configurations 1 to 17, wherein the shortest distance along the second direction between the two of the multiple first memory portions is shorter than ½ of the first pitch.

Configuration 19

The semiconductor memory device according to any one of Configurations 1 to 18, wherein the one of the multiple first memory portions includes:

a semiconductor body extending in the first direction through the stacked body;

a first memory insulating film provided between the semiconductor body and the multiple conductive layers;

a second memory insulating film provided between the semiconductor body and the first memory insulating film; and a memory film provided between the first memory insulating film and the second memory insulating film.

Configuration 20

A method for manufacturing a semiconductor memory device, including:

forming a stacked film on a surface of a base body, the stacked film including multiple first films and a second film, the multiple first films being arranged in a first direction perpendicular to the surface, the second film being provided between the multiple first films;

forming multiple first memory portions and multiple second memory portions, the multiple first memory portions extending in the first direction through a first region of the stacked film and being arranged at a first pitch in a second direction crossing the first direction, the multiple second memory portions extending in the first direction through a second region of the stacked film and being arranged at the first pitch in the second direction, the second region being arranged with the first region in the second direction, a distance along the second direction between a first center in the second direction of one of the multiple first memory portions and a second center in the second direction of one of the multiple second memory portions being longer than the first pitch and shorter than 2 times the first pitch;

forming a hole in the stacked film and removing the multiple first films via the hole; and introducing a material to a space formed where the multiple first films are removed, the material being used to form a conductive layer.

According to the embodiments, a semiconductor memory device and a method for manufacturing the semiconductor memory device are provided in which the storage density can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive layers, insulating layers, memory portions, semiconductor bodies, memory layers, memory insulating films, memory films, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices and methods for manufacturing the same practicable by an appropriate design modification by one skilled in the art based on the semiconductor memory devices and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a stacked body including a plurality of conductive layers, the plurality of conductive layers being arranged in a first direction and extending in a second direction crossing the first direction, the stacked body including a first region and a second region, the second region being arranged with the first region in the second direction;
   a plurality of first memory portions extending in the first direction through the first region and being arranged at a first pitch along the second direction;
   a plurality of second memory portions extending in the first direction through the second region and being arranged at the first pitch along the second direction; and
   an insulating portion extending in the second direction, the insulating portion being adjacent to both of the plurality of conductive layers of the first region and the plurality of conductive layers of the second region of the stacked body in a third direction crossing the first direction and the second direction,
   a distance along the second direction between a first center in the second direction of one of the plurality of first memory portions and a second center in the second direction of one of the plurality of second memory portions being longer than the first pitch and shorter than 2 times the first pitch.

2. The device according to claim 1, wherein a distance along the second direction between the one of the plurality of first memory portions and the one of the plurality of second memory portions is not less than 1.2. times a thickness along the first direction of one of the plurality of conductive layers.

3. The device according to claim 2, wherein a shortest distance along the second direction between two of the plurality of first memory portions is shorter than 1.2 times the thickness.

4. The device according to claim 1, further comprising:
   a plurality of third memory portions extending in the first direction through the first region and being arranged at the first pitch along the second direction; and
   a plurality of fourth memory portions extending in the first direction through the second region and being arranged at the first pitch along the second direction,
   a distance along the second direction between a third center in the second direction of one of the plurality of third memory portions and a fourth center in the second direction of one of the plurality of fourth memory portions being longer than the first pitch and shorter than 2 times the first pitch.

5. The device according to claim 4, wherein $b0=[(P1/2)^2+(P2)^2]^{1/2}-Dx$, and P2 is a distance along the third direction between a position of the first center in the third direction and a position of the third center in the third direction, and
   Dx is a length in the second direction of the one of the plurality of first memory portions.

6. The device according to claim 5, wherein $b1=[((P1+Pd)/2)^2+(P2)^2]^{1/2}-Dx$, and b1 is not less than 1.2 times the thickness, where
   Pd is a difference between a distance along the second direction between the one of the plurality of first memory portions and the one of the plurality of second memory portions and a shortest distance along the second direction between two of the plurality of first memory portions.

7. The device according to claim 1, further comprising:
   a plurality of fifth memory portions; and a plurality of sixth memory portions, the stacked body further including a third region, a fourth region, and a fifth region, the third region being arranged with the first region in the third direction, the fourth region being arranged with the third region in the second direction and arranged with the second region in the third direction, the fifth region being positioned between the first region and the third region and between the second region and the fourth region, the plurality of fifth memory portions extending in the first direction through the third region and being arranged at the first pitch along the second direction, the plurality of sixth memory portions extending in the first direction through the fourth region and being arranged at the first pitch along the second direction, the fifth region being continuous in the second direction.

8. The device according to claim 7, wherein a width along the third direction of the fifth region is larger than the first pitch.

9. The device according to claim 7, wherein the stacked body further includes a sixth region and a seventh region, the first to fifth regions are positioned between the sixth region and the seventh region, the sixth region is continuous in the second direction, and the seventh region is continuous in the second direction.

10. The device according to claim 9, wherein one of the plurality of conductive layers includes a portion included in the sixth region and a portion included in the first region, and a ratio of a volume of a void in the portion included in the sixth region to a volume of the portion included in the sixth region is lower than a ratio of a volume of a void in the portion included in the first region to a volume of the portion included in the first region, or the portion included in the sixth region does not include a void.

11. The device according to claim 10, wherein the one of the plurality of conductive layers further includes a portion included in the fifth region, and a ratio of a volume of a void in the portion included in the fifth region to a volume of the portion included in the fifth region is lower than the ratio of the volume of the void in the portion included in the first region to the volume of the portion included in the first region, or the portion included in the fifth region does not include a void.

12. The device according to claim 1, wherein the one of the plurality of first memory portions includes:
- a semiconductor body extending in the first direction through the stacked body;
- a first memory insulating film provided between the semiconductor body and the plurality of conductive layers;
- a second memory insulating film provided between the semiconductor body and the first memory insulating film; and
- a memory film provided between the first memory insulating film and the second memory insulating film.

13. The device according to claim 1, wherein number of the plurality of first memory portions is not less than 3 and not more than 100.

14. The device according to claim 1, wherein a distance along the second direction between the one of the plurality of first memory portions and the one of the plurality of second memory portions is longer than a shortest distance along the second direction between two of the plurality of first memory portions.

15. The device according to claim 4, wherein a position in the second direction of the first center is between a position in the second direction of the third center and a position in the second direction of the fourth center.

16. The device according to claim 15, wherein the position in the second direction of the fourth center is between the position in the second direction of the first center and a position in the second direction of the second center.

17. The device according to claim 4, wherein a distance along the third direction between a position of the first center in the third direction and a position of the third center in the third direction is shorter than the first pitch.

18. The device according to claim 1, wherein a length in the second direction of the one of the plurality of first memory portions is longer than ½ of the first pitch.

19. The device according to claim 1, wherein a shortest distance along the second direction between two of the plurality of first memory portions is shorter than ½ of the first pitch.

* * * * *